United States Patent [19]

Gavaler et al.

[11] Patent Number: 5,126,318
[45] Date of Patent: Jun. 30, 1992

[54] SPUTTERING METHOD FOR FORMING SUPERCONDUCTIVE FILMS USING WATER VAPOR ADDITION

[75] Inventors: John R. Gavaler, Penn Hills Township, Allegheny County; Timothy T. Braggins, Churchill Borough, both of Pa.

[73] Assignee: Westinghouse Electric Corp., Pittsburgh, Pa.

[21] Appl. No.: 668,579

[22] Filed: Mar. 13, 1991

[51] Int. Cl.$^5$ .................. H01L 39/24; C23C 14/34
[52] U.S. Cl. .................. 505/1; 204/192.24; 505/731
[58] Field of Search .......... 204/192.24; 505/1, 731, 505/816

[56] References Cited

U.S. PATENT DOCUMENTS

| | | | |
|---|---|---|---|
| 3,912,612 | 10/1975 | Gavaler et al. | 204/192.24 |
| 4,043,888 | 8/1975 | Gavaler | 204/192.12 |
| 4,361,472 | 11/1982 | Morrison, Jr. | 204/192.24 |
| 4,400,254 | 1/1982 | Freller et al. | 204/192.29 |
| 4,929,595 | 2/1988 | Wu | 505/1 |
| 4,963,524 | 10/1990 | Yamazaki | 505/1 |

FOREIGN PATENT DOCUMENTS

| | | | |
|---|---|---|---|
| 2-92809 | 4/1990 | Japan | 505/731 |
| 3-5306 | 1/1991 | Japan | 505/731 |
| WO89/11736 | 11/1989 | PCT Int'l Appl. | 204/192.24 |

OTHER PUBLICATIONS

Gavaler et al., Physica B, vols. 165 and 166, pp. 1513-1514, Aug. 16-22, 1990, "Optimization of $T_c$ and $J_c$ in Sputtered YBCO Films".

Primary Examiner—Aaron Weisstuch
Attorney, Agent, or Firm—Daniel P. Cillo

[57] ABSTRACT

A superconducting film is deposited in a closed, non-baked reactor (10) containing a sputtering gas comprising $O_2$ with $H_2O$ vapor addition to preferably provide a total $H_2O$ vapor pressure of between $3 \times 10^{-3}$ mbar to $266 \times 10^{-3}$ mbar, where a copper oxide-based target material (15) is used and the deposition substrates (16) are maintained between 550° C. and 800° C.

6 Claims, 1 Drawing Sheet

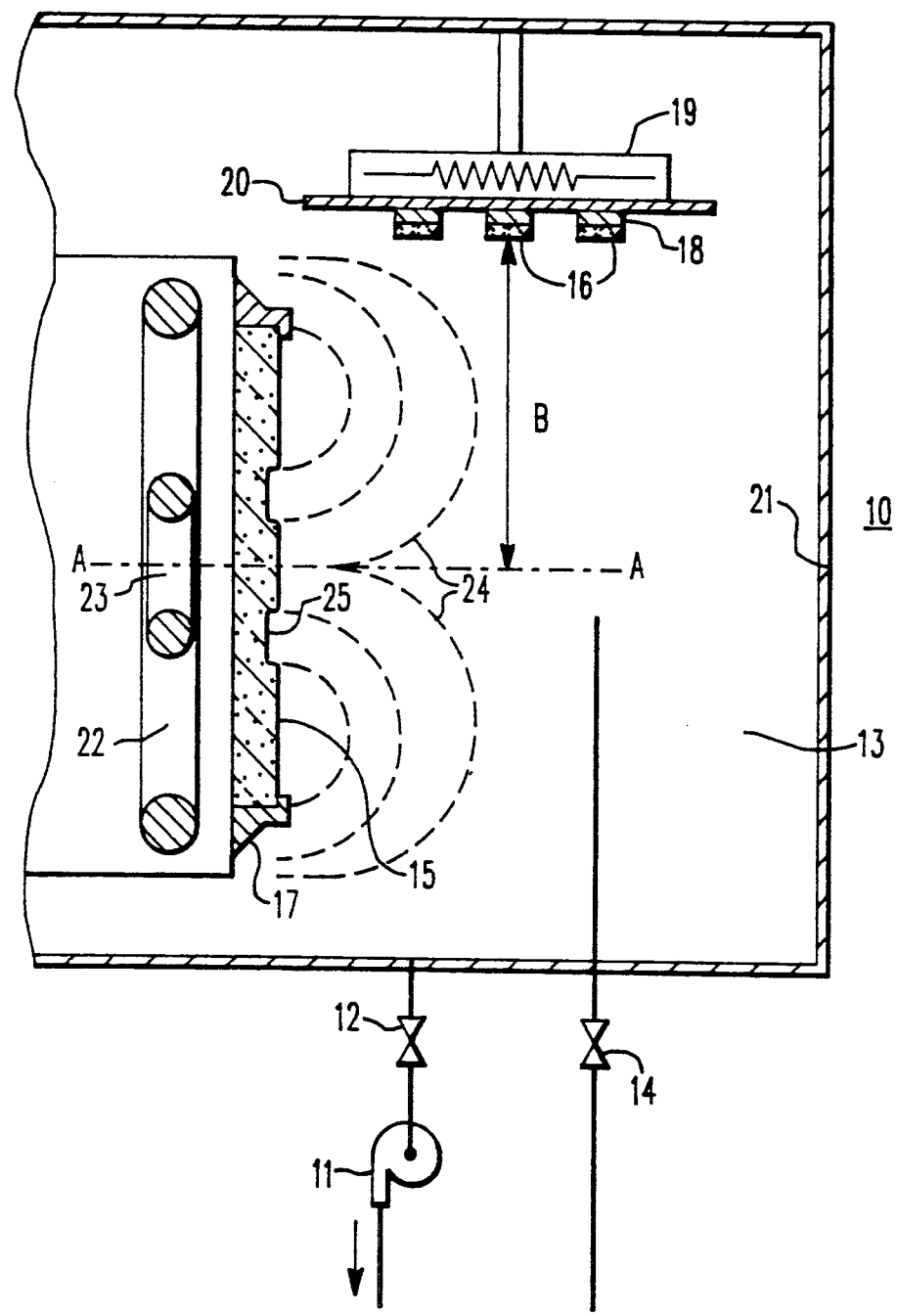

SPUTTERING METHOD FOR FORMING SUPERCONDUCTIVE FILMS USING WATER VAPOR ADDITION

The invention described herein was made in the performance of work under a U.S.A.F. contract identified as Air Force Contract F49620-88-C-0039, in which the Government has rights.

BACKGROUND OF THE INVENTION

Deposition of thin films by a variety of sputtering methods are well known, and taught by, for example, U.S. Pat. No. 4,361,472 (Morrison, Jr.) and U.S. Pat. No. 4,963,524 (Yamazaki). Gases present in the apparatus may include $O_2$, $N_2$, $H_2O$, and $CO_2$, among others. So-called "in-situ," thin film sputtering techniques have been used to deposit superconducting materials such as NbN and $Nb_3Ge$ utilizing heated substrates, as taught by U.S. Pat. No. 3,912,612 (Gavaler et al.) and U.S. Pat. No. 4,043,888 (Gavaler), respectively. Electrically conducting, highly transparent films of $In_2O_3$ have also been sputtered, as taught by U.S. Pat. No. 4,400,254 (Freller et al.). There, water vapor with a pressure of between $3 \times 10^{-3}$ mbar and $5 \times 10^{-3}$ mbar was used as the sole reaction gas, in combination with an inert gas and use of temperature sensitive, water-cooled substrates. These films are used as semiconductors. It was speculated that the water vapor either furnishes $O_2$ for the oxidation of atomized In particles during decomposition in the high frequency plasma, or liberates a reducing compound which prevents excessive oxidation of the target and of the film being produced.

Since the discovery of $YBa_2Cu_3O_7$ (1:2:3 superconducting oxide), many techniques have been investigated for preparing thin films of the compound, for example, rf (radio frequency) sputtering on a room temperature $Y_2BaCuO_5$ substrate material, as taught by U.S. Pat. No. 4,929,595 (Wu). In Gavaler et al. in *Physica B*, Vols. 165 & 166, pp. 1513–1514, Aug. 16–22, 1990, "Optimization of $T_c$ and $J_c$ in Sputtered YBCO Films," both parallel and perpendicular rf and dc magnetron sputtering of $YBa_2Cu_3O_7$ films are taught.

In Gavaler et al., *Physica B*, experiments were conducted in a non-baked vacuum chamber, evacuated to a base pressure in the $10^{-6}$ torr range, using $SrTiO_3$, $LaAlO_3$, MgO, and $ZrO_2$ substrates. Initially, pure $O_2$ or a mixture of $O_2+Ar$ were used as the reactive sputtering gases. The main residual gas as a result of the use of a non-baked deposition chamber was $H_2O$. Values of $T_c$ (critical temperature for superconductivity) of up to 91K were obtained. Water was deliberately added to the sputtering gas in certain parallel configuration sputtering tests in the amount of approximately $13 \times 10^{-3}$ mbar (10 mtorr), With substrate temperatures at 670° C. In the parallel substrate-target configuration, film $T_c$'s of greater than 90K were obtained, which were generally about 5K better than films made without the addition of water under the specific experimental conditions described. The same $H_2O$ addition using the perpendicular substrate-target geometry, which under the specific conditions described produced $T_c$ values of greater than 90K without addition of water vapor, produced no further improvement in the $T_c$'s of the sputtered films, and in fact had, at that time the perceived negative effect of producing Cu-O particles in the films.

There has been a long-felt need to provide $YBa_2Cu_3O_7$ films with good and reproducible superconducting properties. There has also been a need to slow the deterioration of $T_c$'s of the films which are made from targets which have had long usage. It is one of the main objects of this invention to provide a process to solve such problems.

SUMMARY OF THE INVENTION

Accordingly, the invention resides in a method of preparing metallic oxide films on a substrate through the sputtering of copper oxide-based target material onto a heated substrate in a closed reactor containing a sputtering gas comprising $O_2$ and residual impurity amounts of $H_2O$ vapor having a pressure below approximately $1.0 \times 10^{-3}$ mbar (0.77 mtorr), characterized in that the sputtering gas contains added $H_2O$ vapor, to provide a total $H_2O$ vapor pressure in the reactor over that present as residual impurity and up to $266 \times 10^{-3}$ mbar, and a thin copper oxide-based film having superconducting capability is in-situ deposited at a substrate temperature of from 550° C. to 800° C., wherein substantial target erosion does not appreciably affect critical temperature values of the deposited film as deposition continues with time.

Preferably, the substrate will be disposed at a 90° angle to the target surface, the target will comprise a barium-copper oxide material, most preferably $YBa_2Cu_3O_7$, in pressed powder form, and the deposited film will be cooled slowly in oxygen. A useful addition of sputtering gas provides a total pressure of from $100 \times 10^{-3}$ mbar to $300 \times 10^{-3}$ mbar. A useful addition of water vapor provides a total $H_2O$ pressure of from $17 \times 10^{-3}$ mbar to $266 \times 10^{-3}$ mbar. An effective sputtering gas within the reactor consists of $(65$ to $130) \times 10^{-3}$ mbar of $O_2 + (25$ to $75 \times 10^{-3})$ mbar of an inert gas such as $Ar + (7$ to $26) \times 10^{-3}$ mbar of $H_2O$ vapor.

The addition of the substantial amounts of water vapor described, over that already present as a residual impurity in the reaction vessel, allows higher $T_c$ values for deposited yttrium-barium-copper oxide superconducting films; allows consistently high $T_c$ values even when films are deposited from well used, eroded targets; allows deposition at a substantially lower temperature than the 670° C. standard minimum temperature, allows the use of new substrate materials; allows elimination of standard silver paste as a thermal bond for the substrates; and finally, allows deposition of uniform quality film over a much larger substrate area than was previously possible.

BRIEF DESCRIPTION OF THE DRAWING

In order that the invention can be more clearly understood convenient embodiments thereof will now be described, by way of example, with reference to the accompanying drawing which shows a simplified partial schematic view of one embodiment of a dc magnetron sputtering apparatus which can be used in the method of this invention.

DESCRIPTION OF THE PREFERRED EMBODIMENTS

Referring now to the drawing, a magnetron sputtering apparatus 10 is shown, with a pump 11 and associated valve 12 to provide a vacuum in the reactor chamber 13, and inlet valve 14 to allow flow of a sputtering gas into chamber 13. The apparatus is not itself heated, being of a non-bakable design, only the substrate and associated support are heated. The target 15 is of the same composition as the film desired to be sputter coated onto one or more coating substrates 16. The target composition can be selected from a copper oxide-based material, preferably a barium-copper oxide based material, and most preferably $YBa_2Cu_3O_7$, a material well known in the art, usually in pressed powder form. The target 15 is usually held in place by some means, such as clamping 17. The substrates 16 are usually held in place by a highly heat conducting metallic paste 18, in the past usually a silver paste. A resistance or other type heater 19, is used to heat the substrates 16, through the metallic paste 17 and metal support 20.

In the arrangement shown, the substrates 16 are perpendicular to the face of the target 15. Other geometries can be used, for example, the target and heater could be placed at point 21, parallel to the face of the target 15. The distance B defines the distance from the centerline A—A of the target 15. Magnets 22 and 23 operate to establish electric and magnetic fields 24 which enhance ionization of the sputtering gas and focusing of the resulting plasma within the reactor chamber, allowing bombardment of the target by the ions, as is well known in connection with magnetron sputtering devices. This bombardment will erode the target material, causing a portion of the target material to deposit on the heated substrates 16. An example of areas of erosion are shown at 25.

In operation, the target 15, such as a pressed $YB_2Cu_3O_7$ powder, and ceramic substrates 16, such as $LaAlO_3(100)$, $SrTiO_3(100)$, $MgO(100)$, $ZrO_2(100)$, $Al_2O_3$, and the like, preferably in single crystal form, are positioned within the closed reactor 10, which is evacuated to a (mostly $H_2O$ vapor) pressure of $1.3 \times 10^{-6}$ mbar ($1 \times 10^{-6}$ torr). A preferred substrate is $LaAlO_3$. Residual $H_2O$ vapor would increase in pressure up to $1.0 \times 10^{-3}$ mbar, when the substrates are heated to about 670° C. prior to deposition. Then, an $O_2$ containing gas would be fed into the closed reactor 10, preferably either pure $O_2$ or a mixture of $O_2$ with Ar or any other inert gas with the pressure in the reactor after the substrates are heated of preferably from $3 \times 10^{-3}$ mbar (2.3 mtorr) to $266 \times 10^{-3}$ mbar (200 mtorr), most preferably from $7 \times 10^{-3}$ mbar (5 mtorr) to $30 \times 10^{-3}$ mbar (40 mtorr).

The substrates can be heated to from 560° C. to 800° C. and the sputtering power can be between 25 watts and 150 watts. In this invention, excellent deposition can occur at from 560° C. to 650° C., allowing use of less expensive substrates and the deposition of films with a different crystal orientation. For example, films with an a-axis orientation, which grow preferably at less than 600° C. (on $LaAlO_3$ substrates), are preferable for Josephson Junction devices. Films with a c-axis orientation grow preferably (on $LaAlO_3$) at higher temperatures, that is over 670° C., and are preferred for microwave devices.

After the substrates are heated and the sputtering gas introduced, the films are deposited. Sputtering is continued until the desired film thickness occurs on the substrates 16. The sputter deposited film will have substantially the same composition as the target material, and in the case of $YBa_2Cu_3O_7$ will be superconducting after cooling in $O_2$; that is, the film need not be post annealed at high temperatures (about 850° C).

After deposition, the substrate temperature will be lowered slowly, preferably from 50° C./hr to 200° C./hr, so that the stoichiometry of the film will not become deficient in oxygen or, if deficient, will have sufficient time to pick up oxygen. The films produced will range in thickness from 20 nm (0.02 micrometer) to any desired thickness. Preferably, the distance of the substrate 16 from the centerline A—A of the target will be from 4 cm to 8 cm in the perpendicular configuration, and from 4 cm to 8 cm from the target surface in the parallel configuration. The method of this invention is applicable to either rf or dc magnetron sputtering.

The invention will now be illustrated with reference to the following Example, which is not to be considered limiting in any way.

EXAMPLE

An off-axis, non-heated, magnetron sputtering reactor, somewhat similar to that shown in the simplified drawing, was used to deposit $YBa_2Cu_3O_7$ films. The reactor was evacuated to a low vacuum of approximately $1.3 \times 10^{-6}$ mbar ($1 \times 10^{-6}$ torr), leaving residual, impurity $H_2O$ vapor having a pressure of approximately $1.3 \times 10^{-6}$ mbar when the reactor is cold but which can rise to a pressure of $1.0 \times 10^{-3}$ mbar when the reactor becomes heated during the heating of the substrate to 670° C. The substrate was a 1 cm × 1 cm × 0.05 cm thick, single crystal $LaAlO_3$ material held at a temperature of 670° C. The substrate was held in place by silver paste on a nickel block.

Then a sputtering gas consisting of $130 \times 10^{-3}$ mbar (100 mtorr) $O_2 + 65 \times 10^{-3}$ mbar (50 mtorr) $AR + 26 \times 10^{-3}$ mbar (20 mtorr) $H_2O$ vapor was fed into the reactor chamber. The total water vapor pressure in the chamber was approximately $26.5 \times 10^{-3}$ mbar. The target was 5 cm in diameter, 6 mm thick, pressed $YBa_2Cu_3O_7$ powder, consisting predominantly of the superconducting orthorhombic phase. The sputtering power was 60 watts, and the distance between the substrate surface and the centerline of the target was 5.8 cm. Sputtering continued until $YBa_2Cu_3O_7$ films having a thickness of 100 nm (0.1 micrometer) were in-situ deposited, over a 6-hour period, on the heated substrate.

The reactor and sputtered film were then cooled at a rate of 150° C./hr. The film had the 1:2:3 stoichiometry of $YBa_2Cu_3O_7$, with a $T_c$ of 91K and a $J_c$ of $2 \times 10^{-6}$ amps/cm$^2$ at 77K. Only minor amounts of Cu-O particles were observed. These results were reproducible over a long time period even using substantially eroded targets. By deliberately adding water vapor to the sputtering gas, deposited films with $T_c$'s of over 90K have been reproducibly deposited from a highly eroded target which, without the addition of water vapor, was producing films with $T_c$'s of 80K and less.

A second important discovery was that the addition of extra water vapor allowed the deposition of high-$T_c$ (90K) film over a much larger surface area than could previously be done. As an example, in one experiment substrates were mounted in the center—the 12 o'clock, the 3 o'clock, the 6 o'clock, and the 9 o'clock positions—of a 5 cm diameter substrate holder. Four $YBa_2Cu_3O_7$ films were then sputtered, using added water vapor as described previously. The $T_c$ in every film was greater than 90K. This type of coverage could not be obtained previously even in experiments in which the substrate holder was rotated and a new target was employed.

A third discovery was that high $T_c$ films can be deposited at a significantly lower substrate temperature when water vapor is added, as previously described, to the sputtering gas. Previously, it was found that the minimum temperature for producing the highest quality $YBa_2Cu_3O_7$ films was about 670° C. In the past, reduction of only 20° C. to 30° C. caused $T_c$'s to drop to about 80K. Further reduction in substrate temperature produced films that were not superconducting.

We have now shown that with the deliberate addition of water vapor, within the range set forth, as previously described, films with $T_c$'s as high as 88K can be obtained at a substrate temperature of about 600° C. The result could open the door to the use of new substrate materials which are stable at less than or equal to 600° C. Also, the ability of obtaining high quality $YBa_2Cu_3O_7$ films over a much greater temperature range than previously possible eliminates the need to bond substrates to the holder with silver paste. This method of mounting substrates has been used in the past to ensure good thermal contact between substrates and holder and to maintain the substrate temperature within the relatively narrow range that up to now has been required to deposit the highest quality films superconducting films. The method of this invention will also be applicable to other oxide-based targets and deposited films.

We claim:

1. In a method of preparing metallic oxide films on a substrate through the sputtering of copper oxide-based target material onto a heated substrate in a closed reactor containing a sputtering gas comprising $O_2$, and residual impurity amounts of $H_2O$ vapor having a pressure below approximately $1.0 \times 10^{-3}$ mbar, wherein the improvement comprises a sputtering gas containing added $H_2O$ vapor, to provide a total $H_2O$ vapor pressure in the reactor of from $7 \times 10^{-3}$ mbar to $266 \times 10^{-3}$ mbar, and a thin copper-oxide based film having superconducting capability is in-situ deposited on a substrate disposed at a 90° angle to the target surface, at a substrate temperature of from 550° C. to 800° C., and slowly cooling the sputtered film at a rate of from 50° C./hr to 200° C./hr, wherein substantial target erosion does not appreciably affect critical temperature values of the deposited film as deposition continues with time, and after cooling, the stoichiometry of the film will not be deficient in oxygen.

2. The method according to claim 1, where the target and deposited film consist of $YBa_2Cu_3O_7$ material, the target material being in pressed powder form.

3. The method according to claim 1, where the substrate temperature is from 560° C. to 650° C.

4. The method according to claim 1, where the substrate is $LaAlO_3$, in single crystal form.

5. The method according to claim 1, where the addition of $H_2O$ vapor provides a total $H_2O$ vapor pressure of from $7 \times 10^{-3}$ mbar to $30 \times 10^{-3}$ mbar.

6. The method according to claim 1, where the sputtering gas also contains Ar or other inert gas, the reactor is selected from an rf magnetron and dc magnetron type, and the addition of $H_2O$ vapor provides a total $H_2O$ vapor pressure of from $17 \times 10^{-3}$ mbar to $266 \times 10^{-3}$ mbar.

* * * * *